United States Patent [19]

Minner

[11] 3,919,568

[45] Nov. 11, 1975

[54] CIRCUIT FOR THE PREFERENTIAL STARTING OF A STAGE OF AN ELECTRONIC SEQUENCE HAVING A HOLDING CIRCUIT

[75] Inventor: Willy Minner, Schwaigern, Germany

[73] Assignee: Licentia Patent-Verwaltungs-GmbH, Frankfurt, Main, Germany

[22] Filed: July 30, 1973

[21] Appl. No.: 383,560

[30] Foreign Application Priority Data

Aug. 1, 1972 Germany ............................ 2237764

[52] U.S. Cl. .................. 307/296; 307/254; 307/235

[51] Int. Cl.$^{2}$ ............................................ H03K 1/00

[58] Field of Search ............ 328/106, 226; 307/296, 307/297, 254, 318; 330/133, 134

[56] References Cited

UNITED STATES PATENTS

| | | | |
|---|---|---|---|
| 2,863,139 | 12/1958 | Michelson | 328/106 |
| 2,903,607 | 9/1959 | Danner et al. | 307/297 |
| 3,474,264 | 10/1969 | Hughes | 307/296 |

*Primary Examiner*—Michael J. Lynch
*Assistant Examiner*—B. P. Davis
*Attorney, Agent, or Firm*—Spencer & Kaye

[57] ABSTRACT

A circuit for the preferential starting of a stage of an electronic sequence having a holding circuit has two supply voltage sources of different potentials for driving the circuit, the voltage necessary for starting the preferred stage dropping across a component connected between a control electrode of a switching transistor setting the stage in operation and the potential connection common to the circuit, this component being connected in series with a voltage divider and a constant voltage element at the higher value voltage source, the tapping of the voltage divider being connected by a unidirectional component to the voltage source of lower potential and the loading of this voltage source, resulting only with the presence of the higher potential, being eliminated or considerably reduced when using the voltage of lower potential.

13 Claims, 1 Drawing Figure

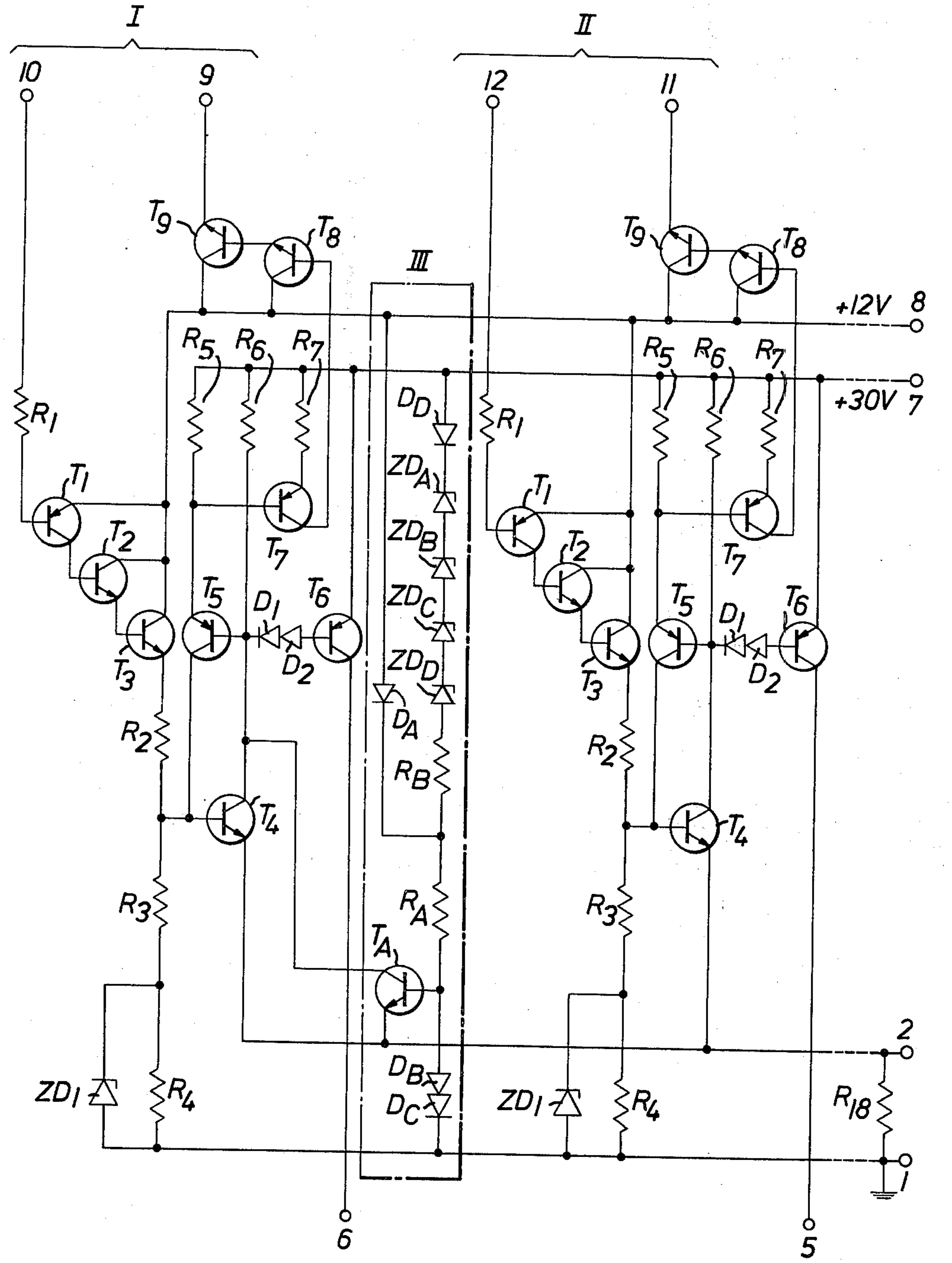
I
II
III
10
9
12
11
T9
T8
+12V 8
+30V 7
R5
R6
R7
R1
T1
T2
T3
T4
T5
T6
T7
D1
D2
DD
ZDA
ZDB
ZDC
ZDD
DA
RB
RA
TA
DB
DC
R2
R3
R4
ZD1
R18
2
1
6
5

CIRCUIT FOR THE PREFERENTIAL STARTING OF A STAGE OF AN ELECTRONIC SEQUENCE HAVING A HOLDING CIRCUIT

BACKGROUND OF THE INVENTION

This invention relates to a circuit for the preferential starting of a stage of an electronic sequence having a holding circuit.

Electronic sequence switches are used for example in radio and television apparatus for the electronic switch-over of channels and ranges. These electronic sequence switches are provided with holding circuits which make sure that the selected channel remains switched on even after the decay of the switched-on stage remains locked by the holding circuit This interlocking can only be eliminated by another channel being selected or the apparatus being switched off in its entirety.

It is one of the main problems to make this sequence switch so free from disturbance that the switch-over from one channel to another or the starting of a non-selected channel by disturbance pulses is excluded. In order to improve this disturbance safety it has already been proposed to switch in a non-linear current/voltage element into the circuit in such a manner that holding current flows through it and it is operated at an operating point with a small differential resistance. Such a non-linear component is, for example, a zener diode. If such a component is operated in the break-down region, it has a very small resistance to disturbance pulses, so that a disturbance voltage is passed without having any influence on the switching state of the sequence circuit. The electronic sequence switches with the holding circuit comprise a plurality of stages connected together, each stage in each case corresponding to a channel to be switched on. The number of stages is therefore dependent on the number of channels available for selection.

Many times it is desired that one channel be prefered when starting-up the apparatus and be always automatically switched on when starting up the apparatus even if, when switching off the apparatus, another channel was switched on.

Usually, two voltage sources are necessary for choosing channels, namely a voltage for the range selection (e.g. UHF or VHF band I or band III) and a further voltage for the frequency selection (e.g. channel 6 or channel 8) which must be switched on by the electronic sequence circuit.

The stabliised voltage source, which is the voltage with the higher value and is used for the frequency selection, may, in addition, be loaded only lightly in order not to endanger the frequency stability. For this reason, only a minimum current e.g. 0.1 to 0.3 mA is available for the circuit which is provided for the preferential starting of stage 1.

Such stabilised light loading can be achieved by rising a correspondingly high valued resistance. In the case of a stabilised voltage, which has, according to the stabilising element, e.g. 30 or 36 Volts, such a resistance must be about 180 kOhm. Such a large resistance can not be realised practically in an integrated semiconductor circuit, since the smallest possible dimensions present and the conventional doping ratios, such a resistance must have a length of approximately 10 mm with a width of 10 um.

SUMMARY OF THE INVENTION

It is an object of the invention to provide a circuit for the preferential starting of a stage of an electronic sequence switch, which is particularly suitable for the integration in a semiconductor body. In this case, it is suitable to start from an electronic sequence circuit, by which two voltage sources of different potential are connected.

According to the invention, there is provided a circuit for the preferential starting of a stage of an electronic sequence circuit having a holding circuit, for the drive of which are provided two supply voltage sources of different potentials, in which the voltage necessary for starting the preferred stage drops across a component which is connected between the control electrode of a switching transistor setting the stage in operation and the potential connection common to the circuit, in which this component is connected in series with resistances forming a voltage divider and at least one constant voltage element at the higher value voltage source, in which the tapping of the voltage divider is connected by means of a component which is permeable to current in only one direction, to the voltage source of lower potential, and in which the loading of this voltage source, resulting only in the presence of the higher potential, is eliminated or at least considerably reduced when using the voltage of lower potential.

BRIEF DESCRIPTION OF THE DRAWINGS

The invention will now be described in greater detail, by way of example, with reference to the drawing, the single FIGURE of which is a circuit diagram of one form of the invention.

DESCRIPTION OF THE PREFERRED EMBODIMENT

Basically, the invention proposes that the voltage necessary for the starting of the preferred stage drops across a component, which is held between the control electrode of a switching transistor setting the stage in operation and the circuit of common potential connection, that this component is connected in series with resistances forming a voltage divider and at least a constant voltage element to the higher value voltage source, that the tapping of the voltage divider is connected through a component permeable only in one direction for the current, to the voltage source of lower potential, and that the components are so dimensioned that the load resulting only from the presence of the higher potential, of this voltage source, is eliminated by inserting the voltage of lower potential or is at least considerably reduced.

The potential connection common to the circuit is usually the ground connection. The component for producing the voltage, by which the preferred stage is set in operation, is preferably one or more diodes operated in the forward direction. Since the downstream connected circuit transistor is driven by this voltage, at least two diodes must be connected in series. Across these diodes then approximately double the base-emitter-voltage of the transistor drops, which is necessary for driving the transistor, so that this transistor can be driven with certainty. A Zener diode can also be used for producing the voltage setting the preferred stage in operation instead of diodes.

The constant voltage elements, which are connected in series with these diodes and resistances, preferably comprise Zener diodes. In each case, the Zener breakdown voltage drops across the Zener diodes. The number of Zener diodes connected one after the other depends on the size of the supply voltage and thus thereafter to what extent this supply voltage has to be broken down to produce the voltage causing the starting. The Zener diodes are connected between one end of the voltage divider and a higher valued voltage source.

The invention will now be described in greater detail by reference to an exemplary embodiment. For the better comprehension a sequence circuit, comprising two stages and having a holding circuit, is briefly explained at the same time.

The sequence switch shown in the drawings made up of the stages I and II has the task, with the application of a negative pulse to the input electrodes 10 or 12 of the transistor $T_6$ to switch on, for frequency selection, and the transistors $T_8$ and $T_9$ for the range of the desired channel. If, for example, stage I, is switched on, this stage I is to be switched off if a negative pulse is fed to the electrode 12 of stage II. In this way, stage II is switched on at the same time. A negative pulse is therefore necessary, because the input transistor $T_1$ is a pnp transistor. A positive pulse is necessary to switch on the stage in the case of an input transistor of opposite region sequence. One stage can also be switched to another stage in that a pulse is fed to the resistance $R_{18}$ which is common to both stages and is connected between the poles 1 and 2. The circuit part given the reference III shows the circuit which is necessary for the preferred starting of stage I when switching the apparatus on.

The transistors $T_1$–$T_3$ connected one after the other permit a pulse to pass only in one direction. Thus, in the case of the choice of the transistors shown, the associated stages can be switched on only by negative pulses at the input 10 or 12.

The circuit shown in the drawing has two supply voltage sources. For example, +12 V is applied to connection 8, whereas a voltage of approximately +30 V is applied to connection 7. The latter stabilised voltage can fluctuate considerably from apparatus to apparatus, so that the functionability of the circuit must be guaranteed at least in the region between 30 and 36 Volts.

The input transistors $T_1$–$T_3$ are connected to the connection 8. The transistors $T_2$ and $T_3$ are connected as compound-connected transistors (Darlington circuit) downstream of the pnp transistor $T_1$. 12 Volts are applied to the emitter of $T_1$ and the collectors of $T_2$ and $T_3$. The resistances $R_2$ and $R_3$ and the parallel circuit of the Zener diode $ZD_1$ and the resistance $R_4$ are connected to the emitter of $T_3$.

However, if now a negative pulse is fed through the input resistance $R_1$ to the base electrode of $T_1$, the transistors $T_1$–$T_3$ switch through. A current flows through the resistance $R_2$, $R_3$ and $R_4$, through which the Zener break-down voltage is built up at the Zener diode $ZD_1$. This voltage amounts to, for example, 6.2 Volts. $R_4$ has a high resistance value and serves to reduce the blocking resistance of the Zener diode at voltages which are below the Zener voltage. The resistance $R_3$ is, on the other hand of low value, there is a voltage drop of only a few tenths of a Volt across it. The transistor $T_4$, the control electrode of which is connected to the tap of the voltage divider formed from the resistances $R_2$ and $R_3$, is switched through also, so that now there is a Zener voltage, reduced by approximately the starting voltage $U_{BE}$, across at the resistance $R_{18}$ between terminals 1 and 2. The voltage across $R_{18}$ amounts to for example 5.8 Volts.

The current of the transistor $T_4$ flows through the double diode $D_1D_2$, connected in the collector path and the base-emitter-path of $T_6$, which is thus likewise controlled through. The voltage drop between the electrode 7 (30 V) and the collector of $T_4$, which is simultaneously connected to the base electrode of $T_5$, amounts to about 1.8 V, namely $3xU_{BE}$ in the case of silicon semiconductor components, and opens the transistor $T_5$ and is connected to the connection 7 through the emitter resistance $R_5$. The current through the transistor $T_5$ is determined by the resistance $R_5$. This current now also flows through the path $R_3$ - $ZD_1/R_4$ and makes sure that after the end of the switch-on pulse at $ZD_1$ and thus at the resistance 18 a voltage remains maintained so that the stage remains in the switched-on state.

The emitter of $T_5$ is connected to the base electrode of $T_7$ so that when the transistor $T_5$ is conductive, this transistor $T_7$ is also switched through. In this way, the transistors $T_8$ and $T_9$ connected after the transistor $T_7$ as compound-connected transistors (Darlington circuit) become conductive. The selected range is switched on by these transistors.

The transistors $T_8$ and $T_9$ draw their supply voltage from the 12 volt line. The transistors $T_1$, $T_5$, $T_6$ and $T_7$ are pnp transistors with the selected voltage ratios; the other transistors are of the npn type. Stage II is identical to stage I. If, in the case of a switch-on of stage I, stage II is switched on by a negative pulse at the connection 12, the voltage across the resistance $R_{18}$, which is common to all stages, increases during the pulse. In this way, the current through the transistor $T_4$ of stage I is reduced, until this transistor is blocked and thus stage I is switched off. Stage II is then ready for operation, since the already described operations now proceed, in the same manner as in the case of stage I, in stage II. A switch-over can also be effected by a pulse being fed to the resistance $R_{18}$, by which pulse, the voltage at this resistance is increased. In this way, the switched-on stage is shut off. Simultaneously, a negative switch-off pulse arises at the collector electrode of $T_6$. This pulse is fed to the input electrode of the subsequent stage II and switches this stage on. For example, the electrodes 6 and 12 are connected together by a capacitor for this purpose. Thus, the sequence switch is switched further by one stage with each pulse.

The circuit part III serves for the preferential switching-on of stage I at the start of the apparatus. The load on the 30-Volt source must not exceed a certain value. The load through the circuit III however is not critical if no stage is turned on. As soon as the stage is turned on, however, the load on the 30-Volt voltage source must be considerably reduced by the circuit III. In a special case this load must not exceed 0.2 mA, for example.

The circuit III comprises a series circuit connected between the pole of the 30-Volt voltage source, which series circuit comprises the double diode $D_B$, $D_C$, two resistances $R_A$, $R_B$, four Zener diodes $ZD_A$, $ZD_B$, $ZD_C$, $ZD_D$ and the diode $D_D$. The diode $D_D$ prevents any current from flowing through the Zener diodes if only a low value voltage source is applied. The voltage of approximately 1.2 Volts necessary for starting stage I must drop across the diodes $D_B$, $D_C$ driven in the forward direction. This voltage is fed to the base electrode of the transistor $T_A$, the collector-emitter path of which is connected in parallel to the collector-emitter path of $T_4$. The connection between the resistances $R_A$ and $R_B$ is connected by means of a diode $D_A$ to the 12-Volt pole 8. The load of the 12-Volt voltage source is not critical. However, it must be made certain that stage I is placed on operational readiness immediately after the first voltage source is used. An undesired stage should be prevented from being switched on by a disturbance pulse in the case of the use of the supply voltage source in the time between, determined by the time constants.

It is assumed that the Zener diodes possess a Zener voltage of 6.3 Volts each in an exemplary embodiment. The resistances $R_A$ and $R_B$ are each 5 kOhm. If at first the 30-Volt source is present, a voltage of 25.1 Volts drops across the Zener diodes. A voltage of 1.2 Volts is at the double diode $D_BD_C$. As a result of the two resistances, a current of approximately 0.30 mA then flows. In the case of a voltage of 36 Volts this current increases up to 1mA. This loading is not critical as long as the stage is still not in operation. A voltage of approximately 3 Volts with 30 Volts at pole 7 is applied to the connection between $R_A$ and $R_B$. With the use of the 12 Volt supply this voltage increases in steps up to 11.4 Volts. Then, no more current flows through the Zener diode. The 30 Volt source is thus free of load. If, instead of 30 Volts, there are 36 Volts at pole 7, this voltage source, after the use of the 12 Volt source is still, for all practical purposes, free of load. The maximum permissible current of 0.2 mA flows only at approximately 38 Volts. Thus, the permissible operating range of the supply voltage practically reaches from 27 Volts to 38 Volts.

In the case of other voltage ratios the number and the dimensioning of the components can be matched to the changed ratios.

It will be understood that the above description of the present invention is susceptible to various modification changes and adaptations.

What is claimed is:

1. A circuit for the preferential starting of a stage of an electronic sequence circuit having a holding circuit, for the drive of which are provided a first supply voltage source producing a first potential and a second supply voltage source producing a second potential lower in value than the first potential, in which the voltage necessary for starting the preferred stage drops across a first component which is connected between the control electrode of a switching transistor setting the stage in operation and the potential connection common to the circuit, the switching transistor having two further electrodes defining a path whose impedance is controlled by the potential at its control electrode, the two further electrodes of the switching transistor being connected to the stage which is to be preferentially started in a manner such that a selected voltage at the control electrode switches the path whose impedance is controlled into a conductive state that sets the stage into operation, in which the first component is connected in series with resistances forming a voltage divider and at least one constant voltage element connected to the first supply voltage source, in which the tap of the voltage divider is connected, by means of a second component which is permeable to current in only one direction, to the second supply voltage source, whereby the current load which would be imposed on the first source by the constant voltage element in the absence of the second potential is at least substantially reduced by the application of the second potential to the divider.

2. A circuit as defined in claim 1, wherein the first component, across which the voltage necessary for starting the preferred stage drops, comprises at least one voltage stabilizing component.

3. A circuit as defined in claim 2, wherein said stabilizing component comprises a diode driven in the flow direction.

4. A circuit as defined in claim 2, wherein said stabilizing component is a Zener diode.

5. A circuit as defined in claim 1, wherein said constant voltage element comprises at least one Zener diode driven in the Zener break-down region.

6. A circuit as defined in claim 5, wherein a plurality of Zener diodes are connected one after another to increase the voltage drop across the constant voltage element.

7. A circuit as defined in claim 6, wherein said Zener diodes are connected between one end of said voltage divider and said higher value voltage source.

8. A circuit as defined in claim 1, wherein said second component, permeable to the current in only one direction and connected to said second voltage supply source, comprises a diode driven in the flow direction when the second potential is present.

9. A circuit as defined in claim 1, where in said potential connection common to the circuit is the circuit ground connection.

10. A circuit as defined in claim 5, wherein said Zener diode, is connected in series with a second diode, such that said second diode is driven in the conductive direction when said first voltage potential is present.

11. A circuit as defined in claim 6, wherein said second voltage supply source has a potential of approximately 12 Volts, said first voltage supply source has a potential of approximately 30–36 Volts, wherein there are four of said Zener diodes each with a Zener breakdown voltage of approximately 6 Volts, connected in series, wherein said voltage divider comprises two resistances each of 5 kOhm, and wherein the connection between said two resistances of said voltage divider is connected to said potential of 12 Volts by means of a diode stressed in the flow direction.

12. A circuit as defined in claim 1, wherein said first voltage supply source comprises a stabilized voltage source provided for the choice of frequency.

13. A circuit as defined in claim 1, wherein all the circuit elements are accommodated in a common semiconductor body.

* * * * *